United States Patent
Kronmueller et al.

(10) Patent No.: US 7,382,031 B2
(45) Date of Patent: Jun. 3, 2008

(54) COMPONENT INCLUDING A FIXED ELEMENT THAT IS IN A SILICON LAYER AND IS MECHANICALLY CONNECTED TO A SUBSTRATE VIA AN ANCHORING ELEMENT AND METHOD FOR ITS MANUFACTURE

(75) Inventors: Silvia Kronmueller, Schwaikheim (DE); Ulf Wilhelm, Rutesheim (DE)

(73) Assignee: Robert Bosch GmbH, Stuttgart (DE)

( * ) Notice: Subject to any disclaimer, the term of this patent is extended or adjusted under 35 U.S.C. 154(b) by 412 days.

(21) Appl. No.: 10/518,065

(22) PCT Filed: Dec. 11, 2002

(86) PCT No.: PCT/DE02/04536

§ 371 (c)(1),
(2), (4) Date: Jul. 21, 2005

(87) PCT Pub. No.: WO03/106327

PCT Pub. Date: Dec. 24, 2003

(65) Prior Publication Data

US 2006/0054972 A1    Mar. 16, 2006

(30) Foreign Application Priority Data

Jun. 12, 2002    (DE)  ................................ 102 26 028

(51) Int. Cl.
*H01L 29/84*    (2006.01)
*H01L 21/00*    (2006.01)

(52) U.S. Cl. .............................. 257/419; 257/E29.324; 438/53; 438/404

(58) Field of Classification Search ................ 257/522; 438/411
See application file for complete search history.

(56) References Cited

U.S. PATENT DOCUMENTS

| 5,780,885 | A |   | 7/1998 | Diem et al. |
|---|---|---|---|---|
| 5,877,521 | A | * | 3/1999 | Johnson et al. ............. 257/223 |
| 6,284,567 | B1 |   | 9/2001 | Park |
| 2003/0173330 | A1 |   | 9/2003 | Lutz |

FOREIGN PATENT DOCUMENTS

| JP | 2000-164890 |   | 6/2000 |
|---|---|---|---|
| WO | WO 95/12214 A1 | * | 5/1995 |
| WO | WO 01/71815 A2 | * | 9/2001 |
| WO | WO 01/77009 |   | 10/2001 |

* cited by examiner

*Primary Examiner*—Stephen W Smoot
(74) *Attorney, Agent, or Firm*—Kenyon & Kenyon LLP

(57) ABSTRACT

A method and device are for anchoring fixed structural elements and, e.g., for anchoring electrodes for components, e.g., SOI wafer components, whose component structure is formed in a silicon layer on top of a substrate used as support. The fixed element may be mechanically connected to the substrate via at least one anchoring element made of an anchoring material and extending through the silicon layer. In the case of an SOI wafer, the anchoring element may extend through the silicon layer and the sacrificial layer of the SOI wafer. To this end, in the area of the surface of the fixed element, at least one recess is made in the silicon layer, which may extend through the entire silicon layer and the sacrificial layer down to the substrate. The recess may then be filled with an anchoring material, so that the fixed element is mechanically connected to the substrate via the anchoring element that is thereby created.

26 Claims, 3 Drawing Sheets

COMPONENT INCLUDING A FIXED ELEMENT THAT IS IN A SILICON LAYER AND IS MECHANICALLY CONNECTED TO A SUBSTRATE VIA AN ANCHORING ELEMENT AND METHOD FOR ITS MANUFACTURE

FIELD OF THE INVENTION

The present invention relates to a component, e.g., a sensor element, having a substrate used as support and a silicon layer, in which the component structure is formed. The component structure includes at least one fixed element, e.g., an electrode. Furthermore, the present invention relates to a method for manufacturing such a component.

BACKGROUND INFORMATION

In practice, many components and particularly sensor elements having movable structural elements are manufactured from so-called SOI (silicon on insulator) wafers. The structure of an SOI wafer normally includes a monocrystalline silicon layer connected to a silicon substrate via a silicon oxide layer. The component structure is formed in the monocrystalline silicon layer. Movable structural elements are exposed by removing the silicon oxide layer under these structural elements. For this reason, the silicon oxide layer is also called a sacrificial layer. The sacrificial layer is usually removed in an etching process, in which normally other parts of the component structure are undercut as well. This proves problematic in practice, especially with regard to fixed elements of the component structure such as electrodes, for example. That is to say, in sacrificial layer etching, the silicon oxide underneath the electrodes is attacked as well. To date, it is only possible to ensure that the electrodes are mechanically anchored to the silicon substrate if the electrodes have certain minimum dimensions, so that they are not completely undercut during the etching of the sacrificial layer.

SUMMARY

An example embodiment of the present invention provides a device and method for anchoring fixed structural elements and, e.g., for anchoring electrodes for components whose component structure is formed in a silicon layer on top of a substrate used as support. The foregoing may be suitable for components manufactured from SOI wafers.

According to an exemplary embodiment of the present invention, the fixed element of the component structure may be mechanically connected to the substrate via at least one anchoring element made of an anchoring material and extending through the silicon layer. In the case of an SOI wafer, the anchoring element may extend through the silicon layer and the sacrificial layer of the SOI wafer. To this end, in the area of the surface of the fixed element, at least one recess may be made in the silicon layer, which extends through the entire silicon layer and the sacrificial layer down to the substrate. The recess may then be filled with an anchoring material, so that the fixed element may be mechanically connected to the substrate via the anchoring element that is thereby created.

According to an exemplary embodiment of the present invention, it is possible to connect fixed elements of the component structure mechanically to the substrate with the aid of anchoring elements. The sole prerequisites for a reliable anchoring are that the anchoring material is of sufficient mechanical strength and is not substantially attacked by the processes used in manufacturing the component, e.g., by the etching of the sacrificial layer. An exemplary embodiment of the present invention may provide for the implementation of the smallest component structures, which may be firmly connected to the substrate, and thus contributes to the miniaturization of components.

With regard to miniaturizing the component as much as possible and anchoring it reliably, the anchoring element may be situated essentially at the center of the surface of the fixed element. To this end, the silicon layer and, in the case of an SOI wafer, the sacrificial layer may be patterned accordingly.

Anisotropic etching processes such as trenching, for example, are suitable for pattering the silicon layer, since anisotropic etching processes facilitate the creation of relatively deep yet narrow recesses. In this manner, it is possible to minimize the space required for the component structure. By continuing the anisotropic etching process for patterning the silicon layer, the sacrificial layer may be patterned accordingly. Alternatively, the sacrificial layer may also be patterned using an isotropic etching process. Namely, during the isotropic etching of the sacrificial layer, the edge region of the recess in the silicon layer is undercut as well. The subsequent filling of the recess extending through the silicon layer and the sacrificial layer produces an anchoring element, which, on account of its barbed structure as well as on account of the enlarged surface connecting it to the substrate, may ensure a particularly strong anchoring of the fixed element.

In an exemplary embodiment of the present invention, the anchoring material may be deposited on the silicon layer after the silicon layer and the sacrificial layer have been patterned. This results in the growth of the anchoring material on the substrate in the area of the recess, which fills the recess and forms an anchoring element. In addition, the silicon layer may be coated with anchoring material. This coating may be at least partially removed again, taking into account the function of the relevant structural elements of the component.

For an anchoring element that is used to anchor an electrode, an electrically non-conductive anchoring material may be chosen to prevent a short ciruit via the substrate of the component. Silicon carbide SiC and especially silicon-rich silicon nitride SiN may be provided in this regard as anchoring materials. The above-mentioned coating with anchoring material may either extend only over a region of the electrode's surface around the anchoring element or essentially over the entire surface of the electrode. In this case, however, at least one contact hole for the electrode may be formed in the coating. The contact hole may be located outside of the region of the anchoring element, so that the mechanical anchoring of the electrode and its electrical connection are spatially decoupled.

In an exemplary embodiment of the present invention, a cap diaphragm may be formed over the component structure, via which electrical contact may be established with the electrodes of the component structure. The cap diaphragm may also be mechanically connected to the substrate via the anchoring elements.

DETAILED DESCRIPTION

Figure 1:
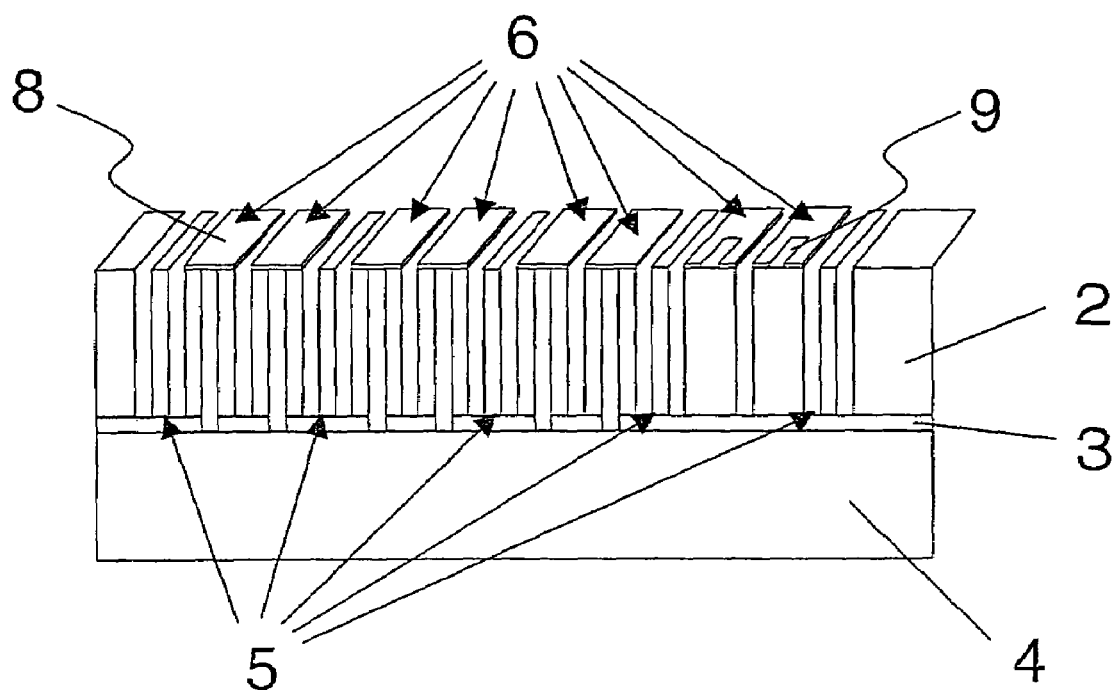
FIG. 1 shows the perspective representation of a sensor structure according to an exemplary embodiment of the present invention having movable and fixed elements.

An exemplary embodiment for a component according to the present invention represented in the figures is a sensor element 1 for recording accelerations.

Sensor element 1 may be manufactured from an SOI wafer containing a monocrystalline silicon layer 2, which may be connected via a sacrificial layer 3 to a substrate 4, in this case a silicon substrate. Sacrificial layer 3 may be a silicon oxide layer. The sensor structure may be formed in monocrystalline silicon layer 2 and may include movable elements 5, upon which an acceleration may act. The deflections of movable elements 5 from their rest position may be recorded with the aid of electrodes 6, which may be fixed elements of the sensor structure.

According to an exemplary embodiment of the present invention, each electrode 6 may be mechanically connected to substrate 4 via one anchoring element 7. To this end, anchoring elements 7 may be positioned essentially at the center of the respective electrode surface and extend through entire silicon layer 2 and through sacrificial layer 3 down to substrate 4. Anchoring elements 7 may be formed of an electrically non-conductive anchoring material. Silicon-rich silicon nitride SiN may be used as anchoring material, since it is also resistant to the HF vapor etching of sacrificial layer 3, and since anchoring elements made of SiN are of sufficient mechanical strength.

The production of the sensor structure represented in FIG. 1 may begin with the creation of the recesses for anchoring elements 7 of electrodes 6 in silicon layer 2. An anisotropic etching process, such as trenching, for example, may be used for this purpose. Subsequently, the silicon oxide in the region of these recesses may also removed. An anisotropic etching process may also be used for this purpose, since the edge regions of the recesses in silicon layer 2 were not undercut. It is also possible to remove sacrificial layer 3 in the region of the recesses using an isotropic etching process, so that the edge regions of the recesses in silicon layer 2 are undercut. This method may produce anchoring elements that extend in the area of sacrificial layer 3 to below silicon layer 2, thus creating a barbed structure.

The recesses, which may extend through entire silicon layer 2 and sacrificial layer 3 down to substrate 4, may be filled with the anchoring material. For this purpose, SiN may be deposited on silicon layer 2 in a deposit step, so that it may grow on substrate 4 in the area of the recesses. A sufficient amount of SiN may be deposited so as to subsequently close the recesses. At the same time, silicon layer 2 may be coated with anchoring material. The SiN coating 8 may be patterned such that it remains on the surfaces of the electrodes. The electrically insulating SiN on the surfaces of the electrodes allows for an electrically insulated mechanical connection of the electrodes to a subsequently produced diaphragm layer, which may be used for the electrical connection of electrodes 6 of sensor element 1. To allow for an electrical contact between electrodes 6 and a connection in the diaphragm layer, a contact hole 9 may be formed for every electrode 6 in corresponding SiN coating 8. Contact opening 9 may be located away from the area of anchoring element 7 so as to decouple the electrical contacting and the mechanical anchoring of electrode 6.

After anchoring elements 7 have been produced as described above, the functional sensor structure may be introduced into silicon layer 2, using an anisotropic etching process, for example, by trenching. In so doing, both movable elements 5 as well as fixed elements of the sensor structure, such as electrodes 6, may be defined. In a further process step, the etching of the sacrificial layer movable elements 5 may be exposed. To this end, sacrificial layer 3 may be removed under movable elements 5 and electrodes 6. However, since the anchoring material is resistant to the HF vapor etching used for removing silicon oxide layer 3, electrodes 6 remain mechanically firmly connected to substrate 4 via anchoring elements 7.

The electrical connection of electrodes 6 of a sensor element 1, as represented in FIG. 1, may be effected via a thin-film diaphragm, which may additionally also seal the sensor structure. As an alternative to such thin-film packaging, the electrical connection may also be achieved via a so-called cap diaphragm, which will be explained in more detail below in light of FIGS. 2 to 4.

Figure 2:
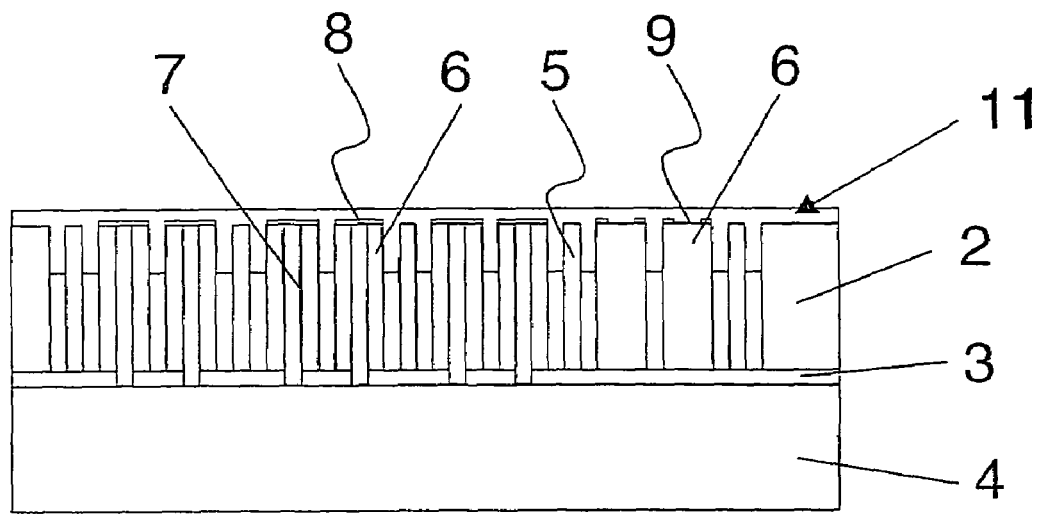
FIG. 2 shows a sectional view of the sensor structure represented in FIG. 1 following the application of a second sacrificial layer for producing a cap diaphragm.

To produce a cap diaphragm, a second sacrificial layer 11, which may be made of silicon oxide, is applied to the sensor structure depicted in FIG. 1. Second sacrificial layer 11 may close the interstices between individual elements 5 and 6, thereby creating a continuous surface, as shown in FIG. 2.

Figure 3:
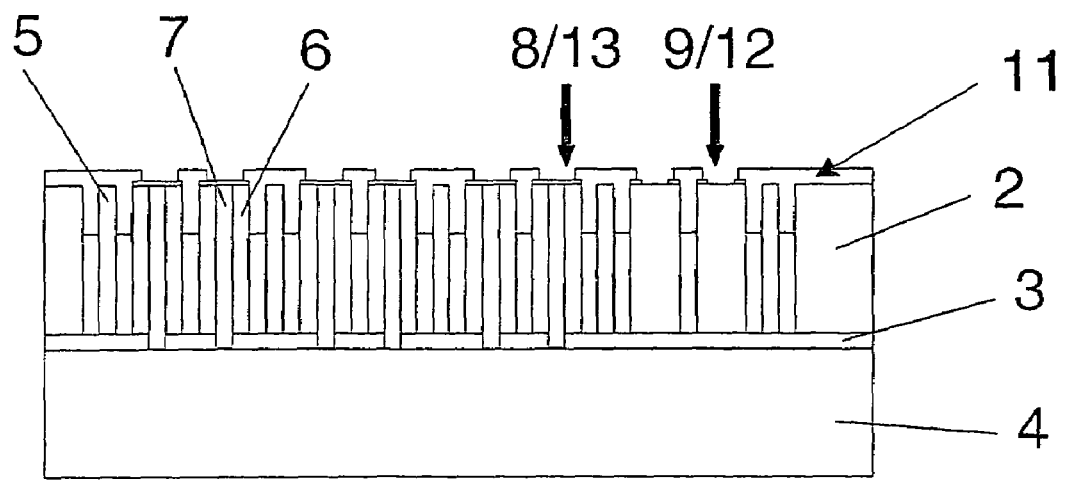
FIG. 3 shows the sensor structure represented in FIG. 2 following the patterning of the second sacrificial layer.

Subsequently, second sacrificial layer 11 may be patterned such that openings 12 and 13 are produced in sacrificial layer 11 wherever the diaphragm layer is to have direct contact with silicon layer 2 (openings 12) or with SiN coating 8 (openings 13). FIG. 3 accordingly shows openings 12 in the area of contact holes 9 and openings 13 in the area of the coated surfaces of the electrodes.

Figure 4:
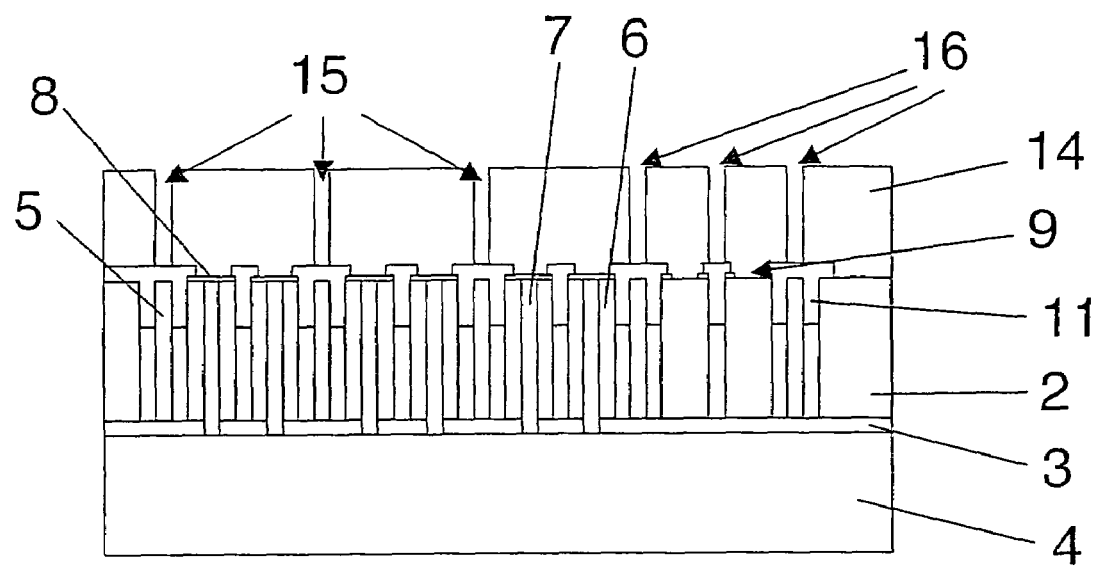
FIG. 4 shows the sensor structure represented in FIG. 3 following the application and patterning of a diaphragm layer.

A diaphragm layer 14 made of polysilicon or SiGe, for example, may then be produced on top of patterned second sacrificial layer 11. Following the application of a starting layer, polysilicon may simply be grown epitaxially. Subsequently, diaphragm layer 14 may be patterned, which in the case of a polysilicon layer may also be achieved by trench etching. On the one hand, this patterning may produce openings 15 for the sacrificial layer etching, during which at least second sacrificial layer 11 and possibly also first sacrificial layer 3 may be removed. On the other hand, the patterning of diaphragm layer 14 may produce openings 16, which electrically insulate the contact lead-throughs between functional silicon layer 2 and diaphragm layer 14 in the area of contact holes 9 from the remaining areas of diaphragm layer 14. These openings 16 are referred to below as insulating trenches. Sensor element 1 featuring the diaphragm layer patterned in this manner is represented in FIG. 4.

Figure 5:
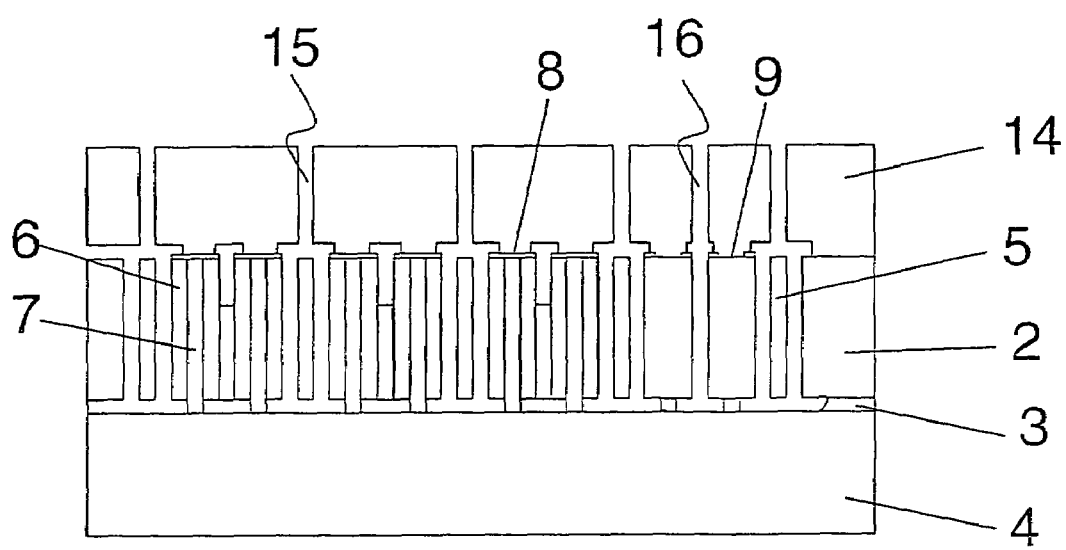
FIG. 5 shows the sensor structure represented in FIG. 4 following the removal of the second sacrificial layer.

At this point, second sacrificial layer 11 and, if it has not yet been done, also first sacrificial layer 3 may be removed again, in order to expose movable elements 5 of the sensor structure. HF vapor etching may be used for this purpose. As was already mentioned, the anchoring material SiN is not attacked by HF vapor etching, so that electrodes 6 remain mechanically rigidly connected both to substrate 4 as well as to diaphragm layer 14 via anchoring elements 7. FIG. 5 shows sensor element 1 having a cap diaphragm 14 produced in this manner. On the one hand, cap diaphragm 14 is in immediate contact with electrodes 6 via contact holes 9, thus enabling their electrical connection. On the other hand, cap diaphragm 14 is mechanically connected to substrate 4 via SiN coating 8 of the electrode surfaces and via anchoring elements 7, so that cap diaphragm 14 is anchored as well.

An electrode 6, electrically connected via cap diaphragm 14, may be separated from the remaining areas of cap diaphragm 14 by an insulating trench 16, in order to achieve the electrical separation of electrode 6. Anchoring element 7 prevents electrode 6 from being completely undercut via insulating trench 16 and other perforations and thus from being detached from substrate 4. Positioning contact hole 9 and anchoring element 7 in different areas of electrode 6 spatially decouples the mechanical anchoring and the electrical connection, so that no complications are to be expected from the insulating trench.

The foregoing may allow for the mechanical anchoring of fixed structural elements such as electrodes, for example, to the substrate. This is achieved with the aid of anchoring elements which may be introduced into the fixed structural elements and which may be made of a material resistant to the etching of the sacrificial layer. In the case of an anchoring of electrodes, the anchoring material may also be electrically insulating, in order to allow for a spatial separation of anchoring and electrical contacting. Silicon-rich nitride or SiC may be provided as anchoring materials.

What is claimed is:

1. A component, comprising:
    a substrate configured as a support; and
    a silicon layer in which a component structure is formed, the component structure including at least one fixed element mechanically connected to the substrate via at least one anchoring element made of an anchoring material and extending through the silicon layer,
    wherein:
        the silicon layer is connected to the substrate via a sacrificial layer, the fixed element mechanically connected to the substrate via at least one anchoring element extending through the silicon layer and the sacrificial layer; and
        the anchoring element includes a barbed structure and extends in an area of the sacrificial layer to below the silicon layer.

2. The component of claim 1, wherein the anchoring element is configured to anchor an electrode and the anchoring material is electrically non-conductive.

3. The component of claim 1, wherein the component is configured as a sensor element.

4. The component of claim 1, wherein the at least one fixed element includes an electrode.

5. A component, comprising:
    a substrate configured as a support; and
    a silicon layer in which a component structure is formed, the component structure including at least one fixed element mechanically connected to the substrate via at least one anchoring element made of an anchoring material and extending through the silicon layer,
    wherein:
        the anchoring element is configured to anchor an electrode;
        the anchoring material is electrically non-conductive; and
        a cap diaphragm is formed on top of the component;
        the at least one electrode is electrically contacted via the cap diaphragm; and
        the cap diaphragm is mechanically connected to the substrate via the anchoring element.

6. The component of claim 5, wherein the anchoring element is located essentially at a center of a surface of the fixed element.

7. The component of claim 5, wherein a surface of the electrode in at least one region around the anchoring element includes a coating made of the anchoring material.

8. The component of claim 7, wherein the coating extends essentially over an entire surface of the electrode, and at least one contact hole is formed in the coating for the electrode, the contact hole located outside the region around the anchoring element.

9. The component of claim 5, wherein the anchoring material includes one of (a) silicon nitride and (b) silicon carbide.

10. The component of claim 5, wherein the component is configured as a sensor element.

11. The component of claim 5, wherein the at least one fixed element includes an electrode.

12. A method for manufacturing a component including at least one fixed element produced in a silicon layer, the silicon layer connected to a substrate via a first sacrificial layer, comprising:
    (a) making at least one recess in the silicon layer in an area of a surface of the fixed element, the recess extending through the entire silicon layer and the first sacrificial layer down to the substrate;
    (b) filling the recess with an anchoring material to mechanically connect the fixed element to the substrate via an anchoring element that is thereby created;
    forming a cap diaphragm on the component;
    producing a second sacrificial layer having a continuous surface on top of the component that is defined in the silicon layer and in which at least one electrode having the at least one anchoring element is already formed;
    patterning the second sacrificial layer;
    removing the second sacrificial layer in an area of the anchoring element and in an area of at least one contact point on the surface of the electrode;
    producing a diaphragm layer on top of the patterned second sacrificial layer; patterning the diaphragm layer;
    creating openings for removing the second sacrificial layer;
    creating openings through which an electrical connection of the electrode to the diaphragm layer is electrically insulated from remaining areas of the diaphragm layer; and
    removing at least the second sacrificial layer.

13. The method of claim 12, wherein the recess in the silicon layer is made in the making step in an anisotropic etching process.

14. The method of claim 13, wherein the recess in the silicon layer is produced by trenching.

15. The method of claim 12, further comprising removing the first sacrificial layer in an area of the recess in an anisotropic etching process.

16. The method of claim 15, wherein the first sacrificial layer in the area of the recess is removed by trenching.

17. The method of claim 12, further comprising:
    removing the first sacrificial layer in an area of the recess in an isotropic etching process;
    wherein the isotropic etching process includes undercutting an edge region of the recess in the silicon layer.

18. The method of claim 12, further comprising:
    depositing the anchoring material on the silicon layer to grow on the substrate in an area of the recess and fill the recess; and
    at least partly removing an anchoring material coating of the silicon layer created by the depositing of the anchoring material.

19. The method of claim 12, wherein the diaphragm layer is produced in the diaphragm layer producing step from one of (a) polysilicon and (b) SiGe.

20. The method of claim 12, wherein the diaphragm layer is grown epitaxially from polysilicon.

21. The method of claim 20, wherein the diaphragm layer is patterned using trench etching.

22. The method of claim 12, wherein the second sacrificial layer is produced in the second sacrificial layer producing step from silicon oxide.

23. The method of claim 12, wherein the component is configured as a sensor element.

24. The method of claim 12, wherein the at least one fixed element includes an electrode.

25. The method of claim 12, wherein openings are created for removing the second and also the first sacrificial layer.

26. The method of claim 12, wherein the second sacrificial layer is removed using HF vapor etching.

* * * * *